US006883060B1

(12) United States Patent
Hayama

(10) Patent No.: US 6,883,060 B1
(45) Date of Patent: Apr. 19, 2005

(54) MICROCOMPUTER PROVIDED WITH FLASH MEMORY AND METHOD OF STORING PROGRAM INTO FLASH MEMORY

(75) Inventor: Masahiro Hayama, Kanagawa (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 09/401,293

(22) Filed: Sep. 23, 1999

(30) Foreign Application Priority Data

Sep. 28, 1998 (JP) .......................................... 10-273659

(51) Int. Cl.⁷ .............................................. G06F 12/00
(52) U.S. Cl. ...................................................... 711/103
(58) Field of Search ................................. 711/103, 156, 711/154, 159, 155; 365/185.33, 185.29

(56) References Cited

U.S. PATENT DOCUMENTS

| | | | | |
|---|---|---|---|---|
| 5,590,306 A | * | 12/1996 | Watanabe et al. | 711/115 |
| 5,603,001 A | * | 2/1997 | Sukegawa et al. | 711/103 |
| 5,802,551 A | * | 9/1998 | Komatsu et al. | 711/103 |
| 5,805,501 A | * | 9/1998 | Shiau et al. | 365/185.29 |
| 6,122,195 A | * | 9/2000 | Estakhri et al. | 365/185.11 |
| 6,160,738 A | * | 12/2000 | Atsumi et al. | 365/185.25 |

FOREIGN PATENT DOCUMENTS

| | | |
|---|---|---|
| JP | 6-274409 | 9/1994 |
| JP | 7-281962 | 10/1995 |
| JP | 8-6865 | 1/1996 |
| JP | 8-98268 | 4/1996 |
| JP | 8-138391 | 5/1996 |
| JP | 8-235028 | 9/1996 |
| JP | 9-238213 | 9/1997 |
| JP | 9-297713 | 11/1997 |
| JP | 10-11277 | 1/1998 |
| JP | 10-124403 | 5/1998 |
| JP | 10-161942 | 6/1998 |
| JP | 10-177527 | 6/1998 |
| JP | 10-254694 | 9/1998 |

* cited by examiner

Primary Examiner—Matthew D. Anderson
(74) Attorney, Agent, or Firm—Sughrue Mion, PLLC

(57) ABSTRACT

The present invention provides a microcomputer provided with a flash memory and a method of storing a program into a flash memory by which a write failure which arises from an interruption of rewriting processing of the flash memory can be detected rapidly and with certainty. The microcomputer provided with a flash memory comprises a rewrite-program area for storing a program for a rewriting processing procedure for the flash memory, and a controller for forming a plurality of flag areas locally in the flash memory when the rewriting program stored in external storage means or the rewrite program area is written into the flash memory, performing determination of completion of a plurality of stages of rewriting processing or determination of whether the plurality of stages are good or bad and recording results of the determination into the respective flag areas.

10 Claims, 10 Drawing Sheets

Fig. 8

| BIT7 | BIT6 | BIT5 | BIT4 | BIT3 | BIT2 | BIT1 | BIT0 |
|---|---|---|---|---|---|---|---|
| Verify error flag | Blank error flag | Rewriting end flag | Verify end flag | Write end flag | Black check end flag | Erasure end flag | Rewriting start flag |

MICROCOMPUTER PROVIDED WITH FLASH MEMORY AND METHOD OF STORING PROGRAM INTO FLASH MEMORY

BACKGROUND OF THE INVENTION

1. Field of the Invention

This invention relates to a microcomputer provided with a flash memory and a method of storing a program into a flash memory, and more particularly to a microcomputer having a self-programming function of rewriting a program stored in a flash memory and a method of storing a program into a flash memory.

2. Description of the Related Art

A data processing apparatus which detects an interruption of rewriting processing of a flash memory to prevent a malfunction is conventionally known and disclosed in Japanese Patent Laid-Open No. 6865/1996.

FIG. 1 is a block diagram showing a general configuration of the data processing apparatus disclosed in the document mentioned above. Referring to FIG. 1, CPU 202 performs, upon initialization of such as changing of a program, rewriting processing of writing data block by block from ROM 203 into flash memory 204 through RAM 206 and writing a start code and an end code representative of a start/end of data in a corresponding relationship to the data into flash memory 204. CPU 202 copies contents of flash memory 204 into RAM 206 each time power supply is made available. Upon such copying, CPU 202 detects a write failure of the data in flash memory 204 based on the start code and the end code.

FIG. 2 shows a data structure of flash memory 204.

Flash memory 204 is divided into a plurality of blocks. A data train including data train 101, start code 103 and end code 104 is written into each of the blocks.

Program codes, a data table and other necessary data are included in the data area of data train 101. Start code 103 and end code 104 are predetermined arbitrary data and added to the start and the end of data train 101.

FIG. 3 is a flow chart illustrating processing of the conventional data processing apparatus when a normal program is started.

Data for one block are read out from flash memory 204 (step C1), and the start code and the end code are compared with respective expected values (step C2). Then, a result of the comparison in step C2 is confirmed (step C3). In such a case that rewriting of data of a block read formerly has been interrupted halfway, the end code or the start code and the end code have not been written as yet, and therefore, the start code and the end code do not coincide with the respective expected values. Thus, setting of flash memory 204 and RAM 206 is performed (step C4), and error processing is performed (step C5). Then, the normal program stored in RAM 206 is started for execution (step CB).

If it is confirmed in step C3 that the start code and the end code coincide with the respective expected values, then the block is written into RAM 206 (step C6). Then, it is confirmed whether the processing has been completed for all data or not (step C7). If the processing for all data has been completed, then the normal program stored in RAM 206 is started for execution (step C8). If it is confirmed in step C7 that the processing for all data has not been completed, the control returns to step C1 to repeat the operations of steps C1 to C6 until transfer of the data for the predetermined blocks to the RAM is completed.

As described above, in the conventional data processing apparatus, when it is confirmed that a start code and an end code coincide with respective expected values or after setting and error processing for the flash memory and the RAM is performed, a normal program is started, thereby preventing a malfunction of the program which arises from a write failure of the flash memory.

However, the conventional data processing apparatus which employs a flash memory has the following problems.

The first problem is that, because writing of a start code and an end code for detecting a write failure of the flash memory is performed only upon rewriting of the flash memory, a write failure cannot be detected if it occurs when the rewriting processing is interrupted in an initial stage.

For example, if an interruption occurs in rewriting processing in an initial stage of erasing processing of the flash memory, then the start code and the end code may possibly remain without being erased even though some of the program codes have been erased already. In this case, a malfunction may occur.

Also when all addresses remain without being erased, since the program prior to the rewriting remains as it is, the operation performed by the data processing apparatus is different from an expected operation.

The second problem is that, because a start code and an end code are added as part of the write data of a data area when they are provided on the boundary between blocks, it is difficult to produce a program since the CPU directly executes a program existing in the flash memory. Specifically, a computer system sometimes has a configuration such that a reset vector or an interrupt vector is fixed to a particular address. In a computer system of this type, if a reset vector or an interrupt vector is fixed to an address into which a start code or an encode should be stored, a program cannot be produced.

Further, although a conventional data processing apparatus is configured to read a program into the RAM once and then execute the program, when it employs a computer having a built-in memory like a single chip microcomputer, a RAM for storing a program to be executed must be prepared additionally for the data processing apparatus, resulting in a higher cost for the data processing apparatus.

The conventional data processing apparatus has a further problem that much time is required to start a normal processing program since the program is transferred from the flash memory to the RAM.

SUMMARY OF THE INVENTION

The present invention has been made in view of the various problems of the prior art described above, and it is an object of the present invention to provide a microcomputer provided with a built-in flash memory and having a self-programming function and a method of storing a program into a flash memory by which a write failure which arises from an interruption of rewriting processing of the flash memory can be detected rapidly and with certainty.

According to one aspect of the present invention, there is provided a microcomputer provided with a flash memory and having a self-programming function of rewriting a program stored in the flash memory, comprising a rewrite program area for storing a program for a rewriting processing procedure for the flash memory, and a controller for forming a plurality of flag areas locally in the flash memory when the rewriting program stored in external storage means or the rewrite program area is written into the flash memory, performing determination of completion of a plurality of stages of rewriting processing or determination of whether the plurality of stages are good or bad and recording results of the determination into the respective flag areas.

In a microcomputer provided with a flash memory, the flash memory may include a plurality of blocks each of which is an erasable unit and includes a data area and a flag area, and the controller may map the data areas of the plurality of blocks to successive addresses.

According to another aspect of the present invention, there is provided a microcomputer provided with a flash memory and having a self-programming function of rewriting a program stored in the flash memory, comprising a rewrite program area for storing a program for a rewriting processing procedure for the flash memory, rewriting means for forming a plurality of flag areas locally in the flash memory when the rewriting program stored in external storage means or the rewrite program area is written into the flash memory, and a controller for performing determination of completion of a plurality of stages of rewriting processing or determination of whether the plurality of stages are good or bad and recording results of the determination into the respective flag areas through the rewriting means.

According to still another aspect of the present invention, there is provided a microcomputer provided with a flash memory and having a self-programming function of rewriting a program stored in the flash memory, comprising a rewrite program area for storing a program for a rewriting processing procedure for the flash memory, rewriting means for forming a plurality of flag areas locally in the flash memory when the rewriting program stored in external storage means or the rewrite program area is written into the flash memory, a controller for performing determination of completion of a plurality of stages of rewriting processing or determination of whether the plurality of stages are good or bad and recording results of the determination into the respective flag areas through the rewriting means, and flag state notification means for comparing, when power supply is made available after the rewriting is completed, values read out from the flag areas with expected values for the flag areas stored in advance and notifying the controller of results of the comparison.

In both of the microcomputers provided with a flash memory, the flash memory may include a plurality of blocks each of which is an erasable unit and includes a data area and a flag area, and the rewriting means may map the data areas of the plurality of blocks to successive addresses.

According to still another aspect of the present invention, there is provided a method of storing a program into a flash memory of a microcomputer provided with the flash memory and having a self-programming function of rewriting the program stored in the flash memory, wherein a plurality of flag areas are formed locally in the flash memory when a rewriting program is written into the flash memory, and determination of completion of a plurality of stages of rewriting processing or determination of whether the plurality of stages are good or bad is performed, whereafter results of the determination are recorded into the respective flag areas.

In the present invention having the construction described above, part of the flash memory is used for flags into which a situation of procedure of rewriting processing of the flash memory should be recorded. When a program of the flash memory is to be executed, the situation of procedure of rewriting can be grasped by confirming the contents of the flags. Consequently, a write failure which arises from an interruption of rewriting processing of the flash memory can be detected rapidly and with certainty.

The above and other objects, features and advantages of the present invention will become apparent from the following description with reference to the accompanying drawings which illustrate examples of the present invention.

BRIEF DESCRIPTION OF THE DRAWINGS

FIGS. 5(A) and 5(B) are diagrammatic views showing a configuration of flash area 4 shown in FIG. 4, and wherein FIG. 5(A) shows a physical configuration and FIG. 5(B) shows a logical configuration;

FIGS. 7(A) and 7(B) are diagrammatic views showing details of the configuration of flash area 4, and wherein FIG. 7(A) shows a physical configuration and FIG. 7(B) shows a logical configuration;

FIG. 8 is a diagrammatic view showing a configuration of flag area 2;

DETAILED DESCRIPTION OF THE PREFERRED EMBODIMENTS

Preferred embodiments of the present invention will be described below with reference to the drawings.

Figure 1:
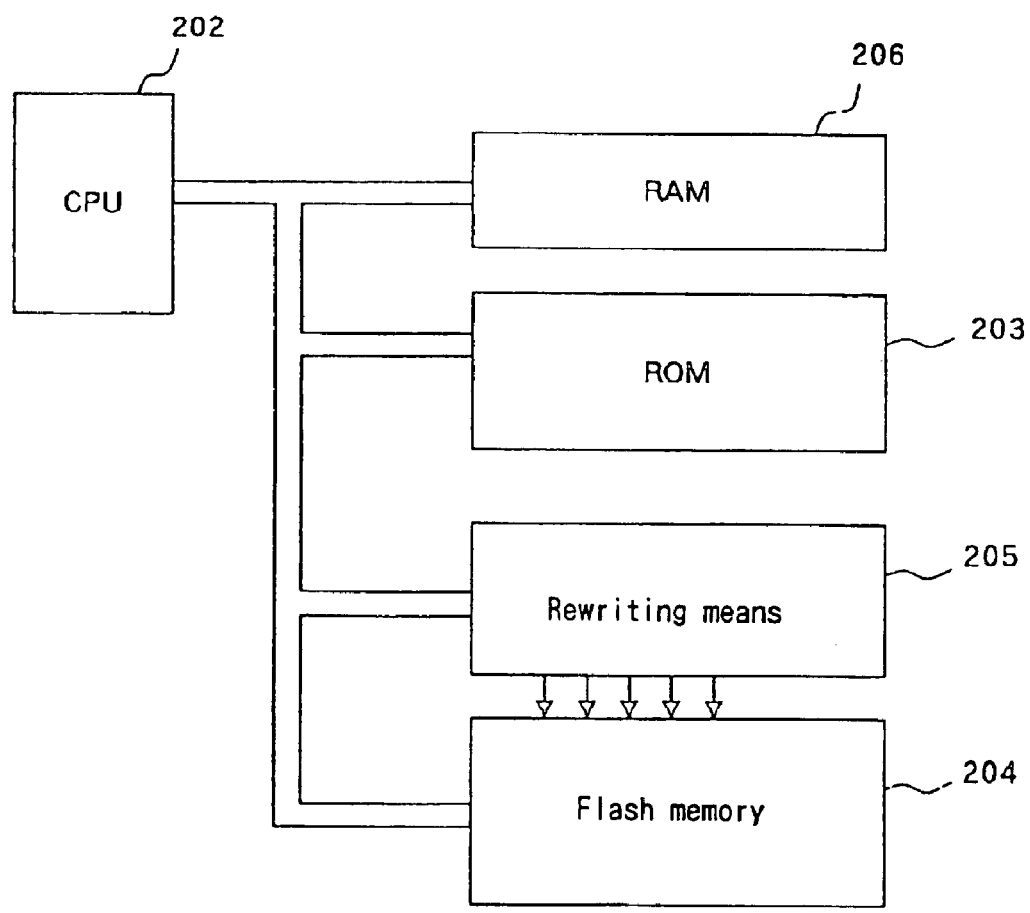
FIG. 1 is a block diagram showing a conventional data processing apparatus.
Figure 2:
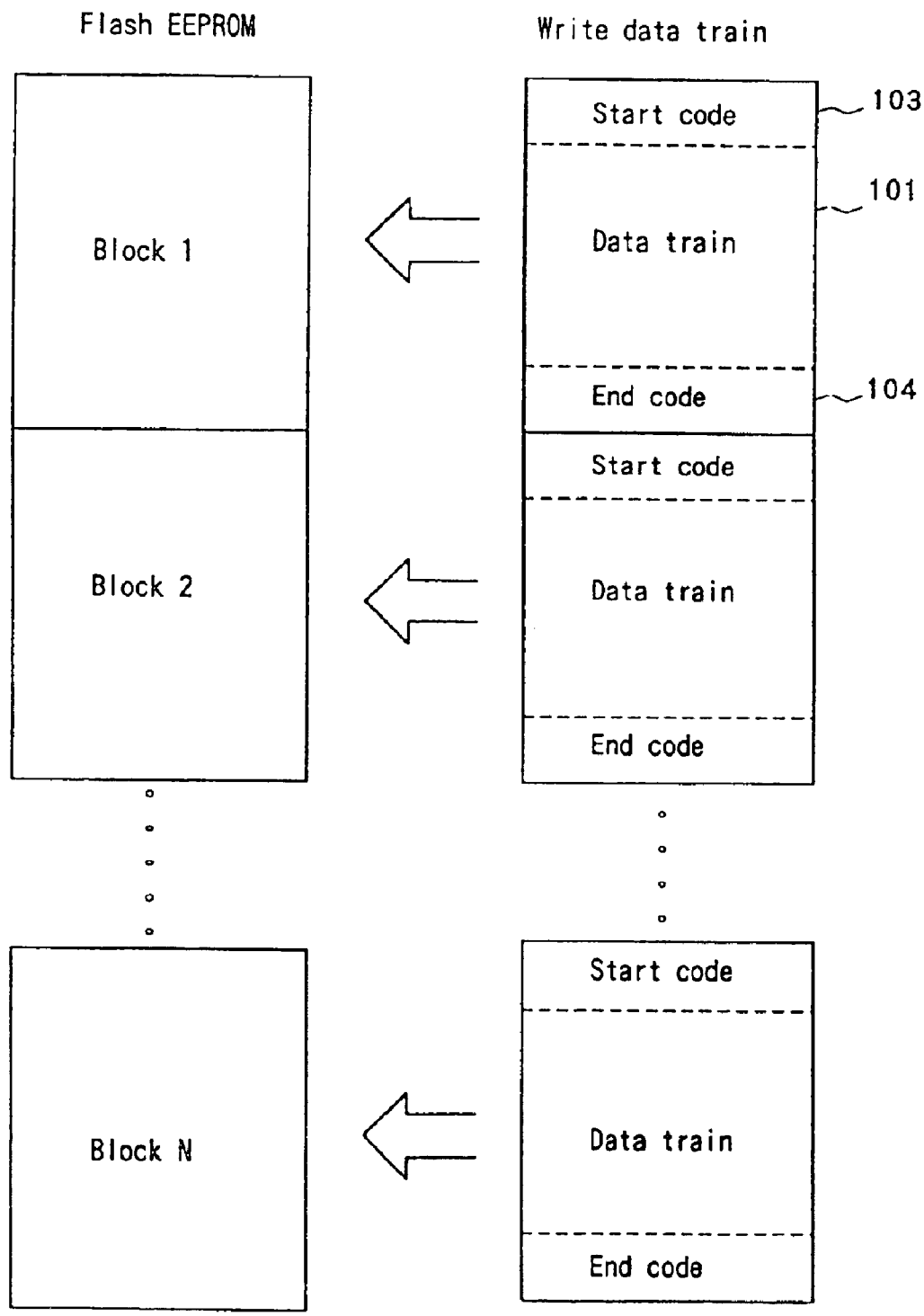
FIG. 2 is a diagrammatic view showing a data structure of a flash memory of a conventional data processing apparatus.
Figure 3:
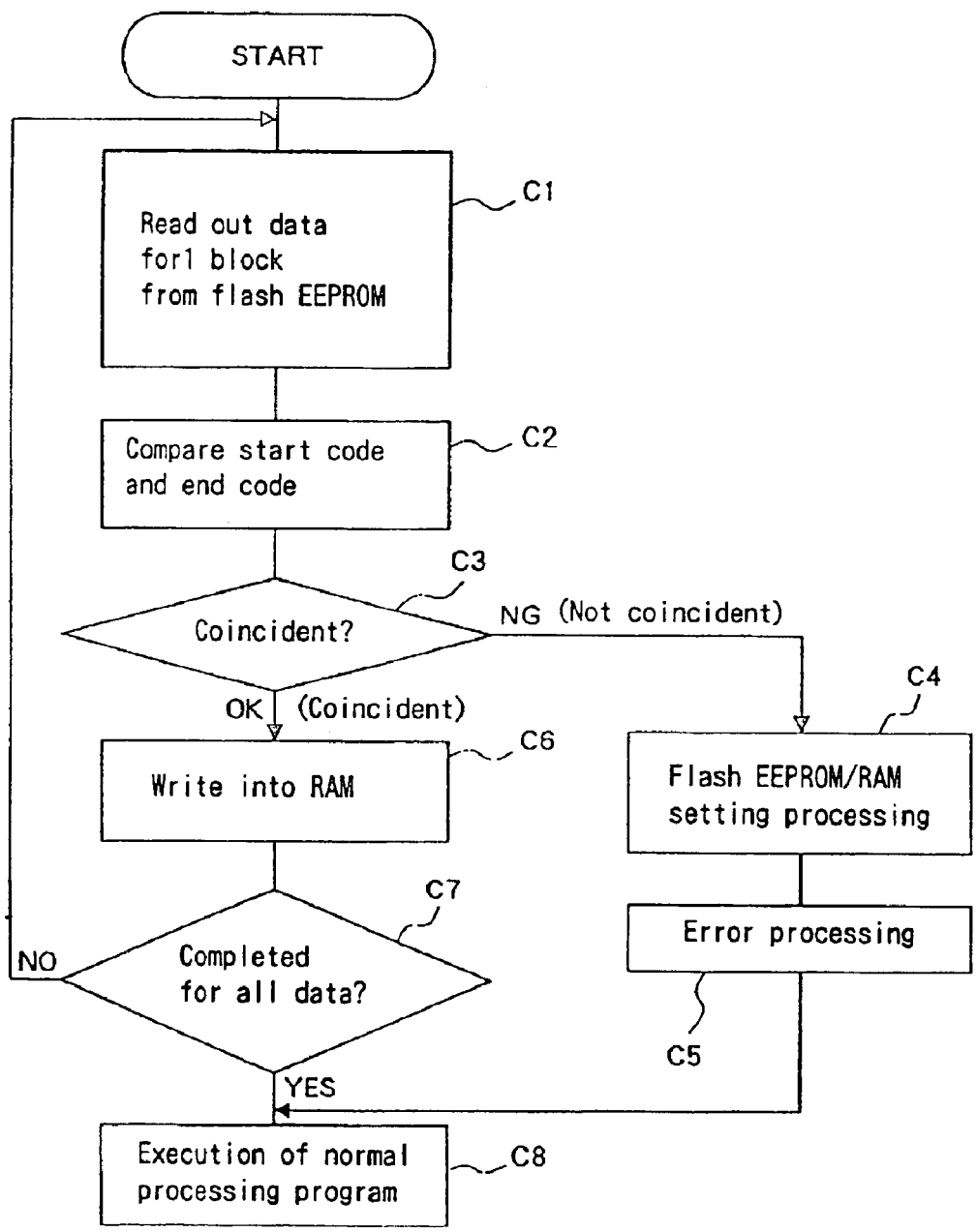
FIG. 3 is a flow chart illustrating processing of a conventional data processing apparatus when a normal program is starts.
Figure 4:
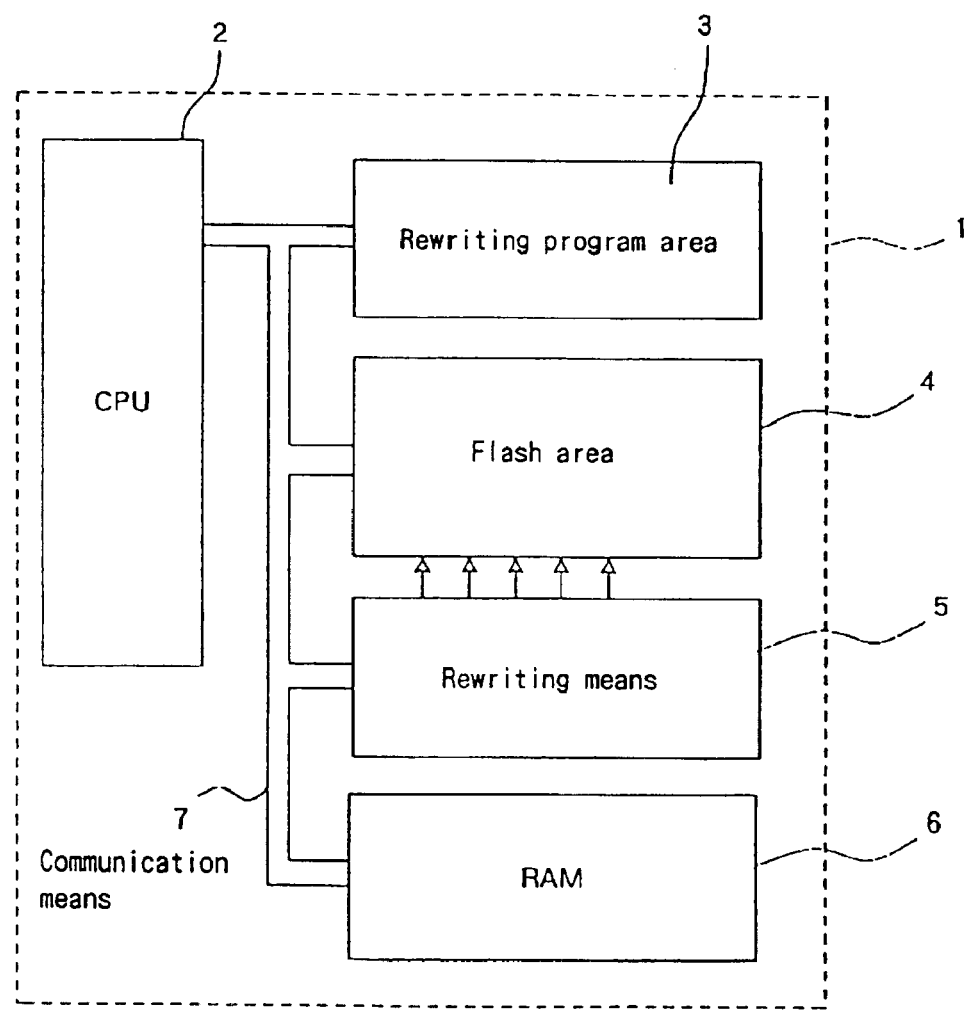
FIG. 4 is a block diagram showing a configuration of an embodiment of the present invention.

FIG. 4 is a block diagram showing a configuration of an embodiment of the present invention. The present embodiment includes microcomputer 1, CPU (control means) 2, rewriting program area 3, flash area 4, rewriting means 5 for rewriting flash area 4, RAM 6 for storing temporary data in processing, and communication means 7 for interconnecting the components.

Figure 5:
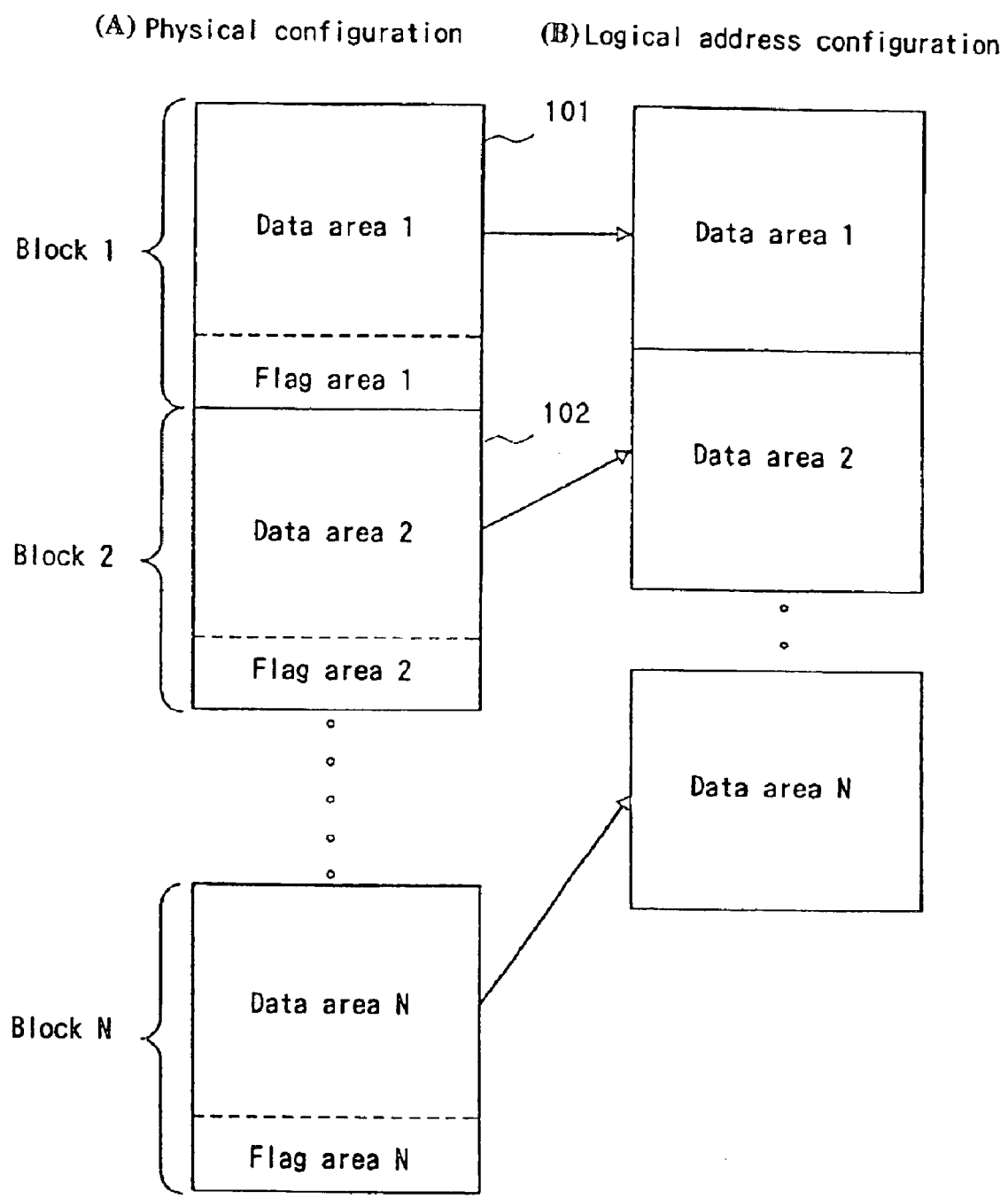

FIGS. 5(A) and 5(B) are diagrammatic views showing a configuration of flash area 4, and wherein FIG. 5(A) shows a physical configuration and FIG. 5(B) shows a logical configuration.

Flash area 4 includes a plurality of blocks each of which forms an erasable unit and includes a flag area for storing a history of rewriting processing and a data area for storing a program, a data table and other necessary data. Here, block 1 which includes data area 1 and flag area 1 is denoted by data 101, and block 2 which includes data area 2 and flag area 2 is denoted by 102.

As shown in FIG. 5(B), the data areas are mapped at logical addresses in continuous space.

Figure 6:
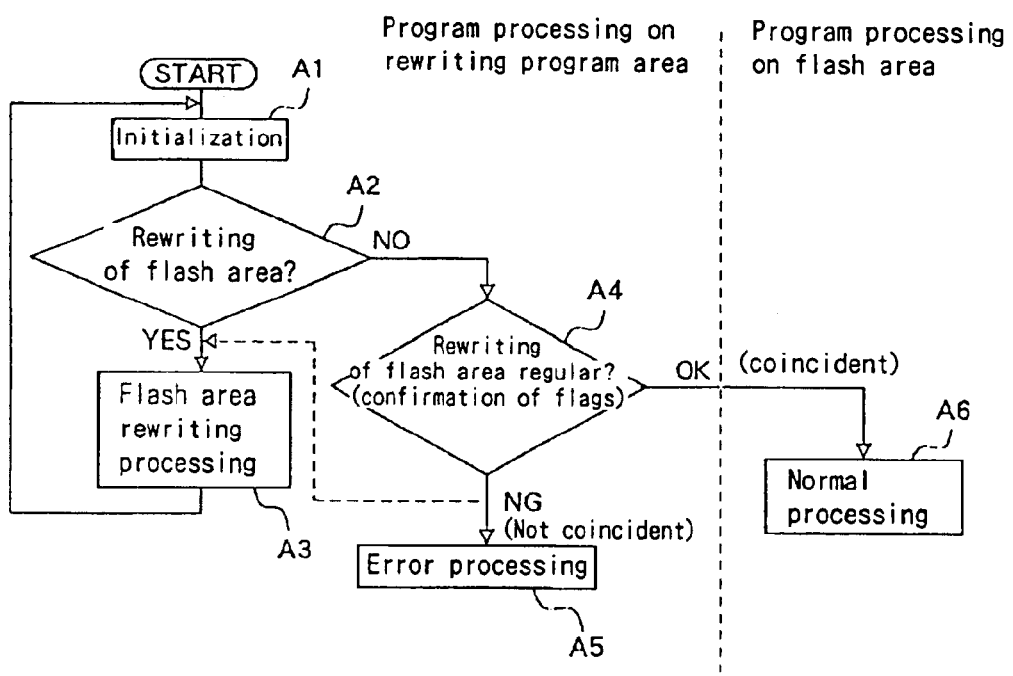
FIG. 6 is a flow chart illustrating operation of the embodiment when power supply is made available.

FIG. 6 is a flow chart illustrating operation of the present embodiment when power supply is made available. Operation of the present embodiment will be described below with reference to FIG. 6.

Rewriting program area 3 stores a program for rewriting flash area 4. Processing by the program stored in flash area 4 is illustrated on the right side of a broken line in FIG. 6, and processing by the program stored in rewriting program area 3 is illustrated on the left side of the broken line.

After power supply is made available, initialization processing for setting the components to initial states is performed (step A1). After the initialization processing, it is checked whether a rewriting request for flash area 4 is present or not (step A2). If a rewriting request for flash area 4 is present, then the rewriting operation is performed (step A3), but if no rewriting request for flash area 4 is present, then it is determined whether the rewriting processing for flash area 4 has been performed regularly (step A4).

The determination of the regularity of the rewriting processing for the flash area in step A4 depends upon determination of whether the flag areas shown in FIG. 5(A) have expected values. If it is determined that the rewriting processing has not been performed regularly, then error processing is performed (step A5), but if it is determined that the rewriting processing has been performed regularly, then normal processing by the program stored in flash area 4 is executed (step A6).

In the rewriting processing in step A3, when each process such as erasure or writing included in the rewriting processing comes to an end, a flag representing this is set. For the expected values to be used for the determination of the regularity of the rewriting processing in step A4, the flags changed by the rewriting processing are used.

From the stored contents of the flash area which has been rewritten in such a manner as described above, whether the rewriting has been performed regularly can be detected by detecting the flags. For example, if the rewriting processing is interrupted midway, the flags remain in the same states as those prior to the interrupted processing and therefore have values different from their expected values, and it is detected from the difference that the rewriting processing of flash area 4 has been interrupted.

In this manner, in the present embodiment, if the processing is interrupted during the rewriting of the flash memory, this can be detected by using a flag representing a history of rewriting of part of the flash memory for the determination of the regularity of the writing processing. Thus, an otherwise possible failure or accident arising from a malfunction of a program can be prevented.

Next, the operation of the embodiment described above will be described in more detail.

Figure 7:
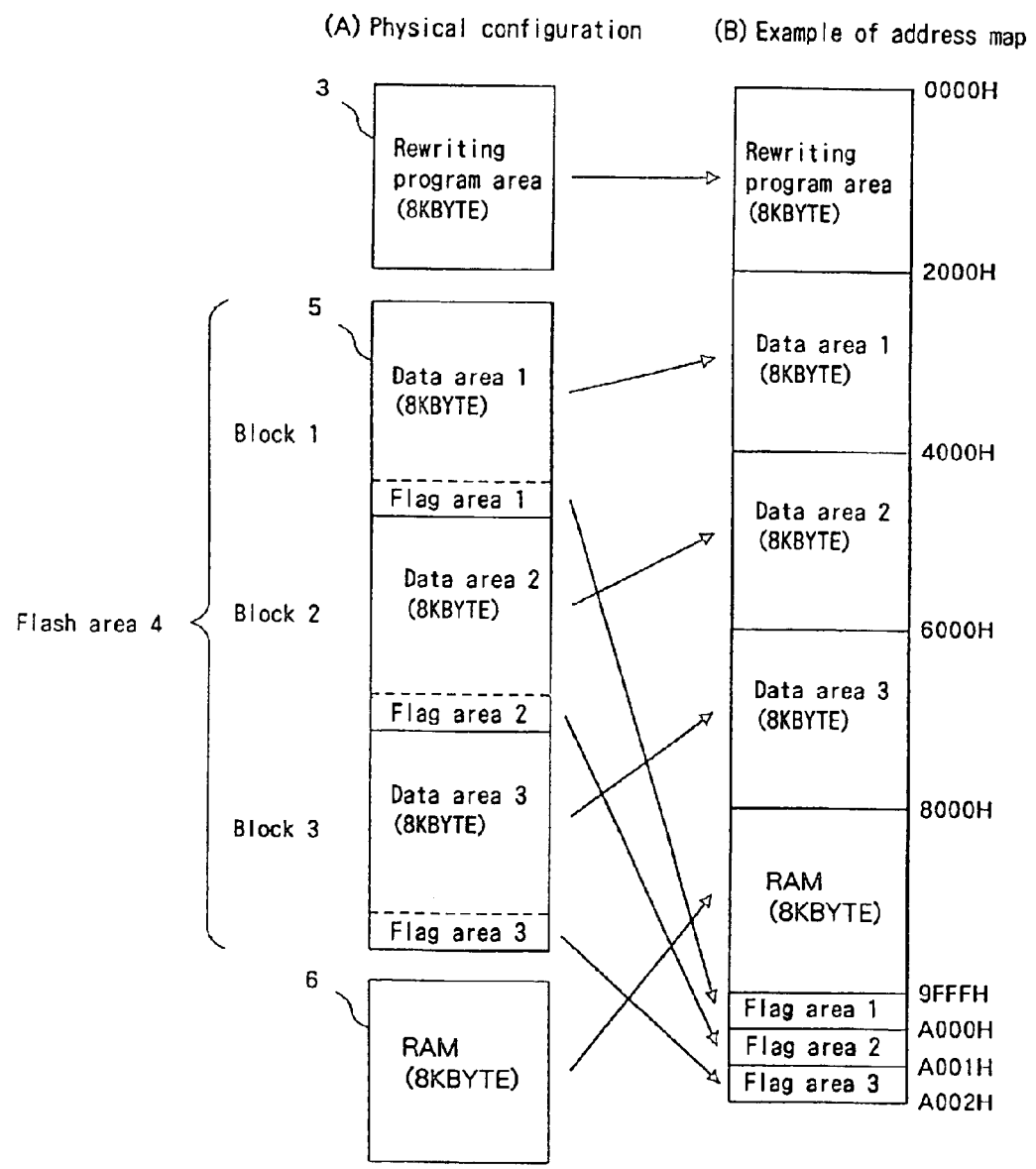

FIGS. 7(A) and 7(B) are diagrammatic views showing details of the configuration of flash area 4, and wherein FIG. 7(A) shows a physical configuration and FIG. 7(B) shows a logical configuration. The configuration of flash area 4 shown in FIGS. 7(A) and 7(B) includes, in addition to the configuration of flash area 4 shown in FIGS. 5(A) and 5(B), rewriting program area 3 for explaining an example of allocation of addresses and RAM 6 for storing temporary data in processing.

Rewriting program area 3 stores the program for rewriting flash area 4. Flash area 4 stores a program for normal operation. The program stored in flash area 4 can be changed to augment functions of the system which employs the present embodiment or to amend a program to eliminate a defect of it.

Rewriting of flash area 4 is performed by rewriting means 5 under the control of CPU 2 in accordance with the program stored in rewriting program area (ROM) 3. In the rewriting, the program in flash area 4 is rewritten into program codes received by communication means 7.

RAM 6 temporarily stores data during operation of a normal program or upon rewriting of rewriting program area 3.

While the example illustrated in FIG. 7(A) includes RAM 6, rewriting program area 3 and flash area 4 which includes 3 blocks each including a data area of 8 Kbytes and a flag area of 1 byte, in order to facilitate production of a program, the memory areas may be mapped in such a manner as illustrated in FIG. 7(B) so that the data areas can be assured continuously in flash area 4.

FIG. 8 is a diagrammatic view showing a configuration of flag area 2.

A flash EEPROM or an EPROM has a common characteristic that a bit which has not been changed to a write value upon writing can be changed later by performing writing to the bit again.

For example, where a flash EEPROM or an EPROM is configured so that a bit is changed to "0" by bit erasure but changed to "1" by bit writing, it is possible to write "1" to the 0th bit once and write "1" to the remaining bits later. However, a bit to which "1" is written once cannot be returned to "1" by later writing.

The example illustrated in FIG. 8 makes use of the fact just described to allocate the flags to 1 byte which is one write unit. To BIT7 to BIT0, a verify error flag, a blank error flag, a rewriting end flag, a verify end flag, a write end flag, a black check end flag, an erasure end flag and a rewriting start flag are allocated, respectively.

Depending upon the structure of cells of a flash memory, the cells are deteriorated by writing thereto. In this case, a greater number of times of writing operations are performed only for the flag area, and this reduces the life of the cells of the flag area. As a countermeasure against this, significance of flags may be allocated in a size of a write unit such as 1 byte.

The flags to be allocated must include at least the rewriting start flag and the rewriting end flag in order to achieve the principal object of the present invention. However, the flags to be allocated should be selected so as to keep a more detailed history so that, when writing is performed after an interruption of rewriting is detected, the rewriting can be performed efficiently by proceeding with the rewriting processing beginning with a process following the process at which the rewriting has been interrupted.

Figure 9:
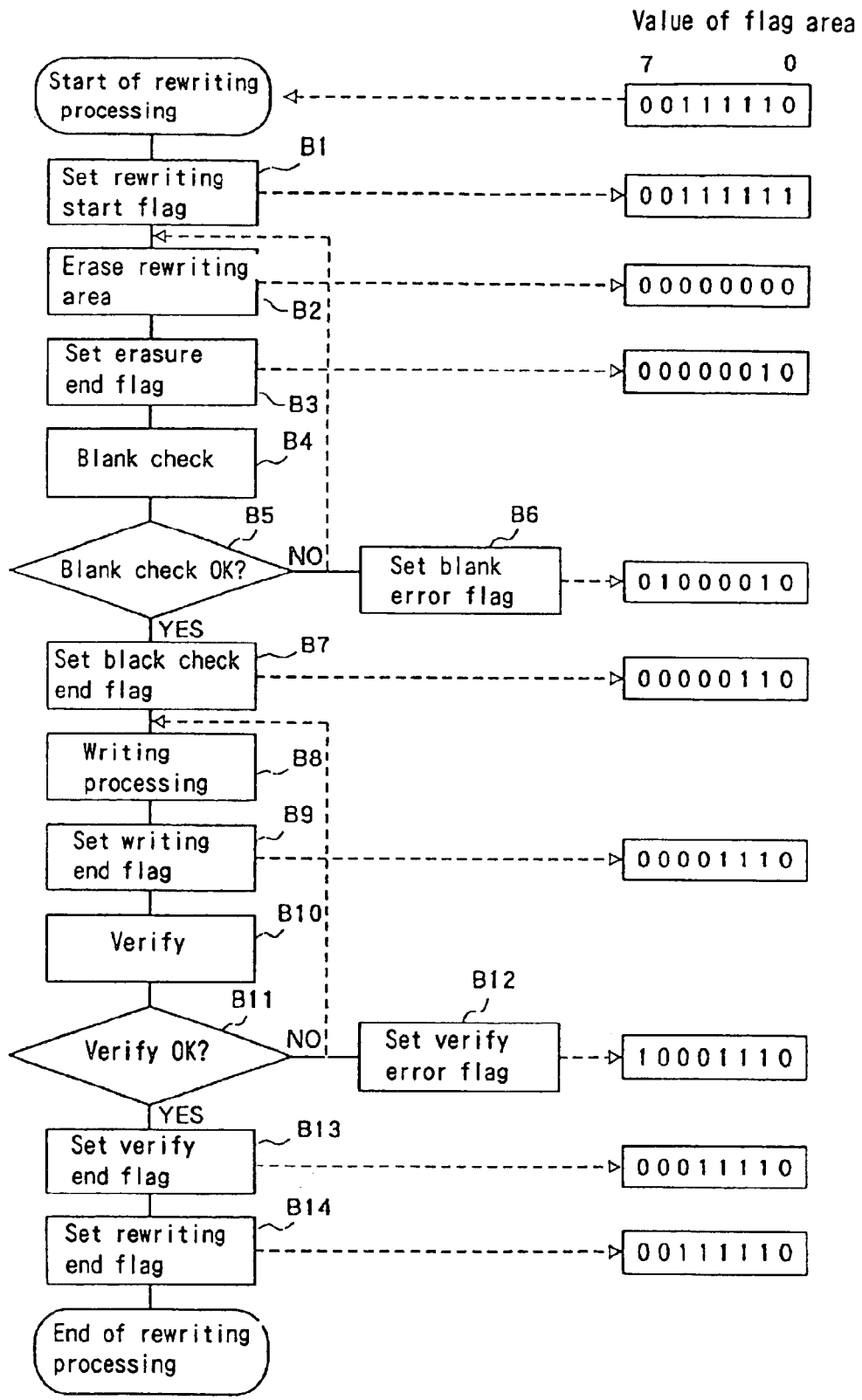
FIG. 9 is a flow chart illustrating operation for rewriting processing of the flag area shown in FIG. 8.

FIG. 9 is a flow chart illustrating operation for rewriting processing of the flag area shown in FIG. 8, and the rewriting processing will be described below with reference to FIG. 9. The following description proceeds on the presumption that the value of each cell of the flash memory is changed to "0" by erasure and to "1" by writing.

Referring to FIG. 9, at a point of time when rewriting processing is started, the flag area has a value "00111110" which is an expected value when rewriting is completed regularly, and in order to set the rewriting start flag which represents that rewriting processing is started, writing into the flag area is performed to change the value of the flag area to "00111111" (step B1).

The setting of the rewriting start flag makes the program stored at present in rewriting program area 3 different from an expected program. Therefore, even if the rewriting processing is interrupted in its initial stage, such interruption of the rewriting processing can be detected from the difference.

Then, erasure of the rewriting area is performed (step B2). Thereupon, also the flag area is erased. Consequently, the flag area now has a value "00000000" without specifically designating the flag area for the change.

Thereafter, the erasure end flag which represents that erasure is completed is set (step B3) to change the value of the flag area to "00000010".

Then, a blank check of the data area is performed in order to confirm whether the erasure has been performed completely (step B4), and then a result of the blank check is confirmed (step B5). If the blank check reveals some incoincidence, the blank error flag is set (step B6). Alternatively, however, the processing beginning with the erasure described above may be performed again.

If the blank check is completed regularly, then the blank check end flag is set (step B7) to change the value of the flag area to "00000110", and then writing processing is performed continuously (step B8).

After the writing is completed, the writing end flag is set (step B9) to change the value of the flag area to "00001110", and a verify operation for confirmation of whether the writing has been performed regularly is performed (step B10).

Thereafter, a result of the verify processing is confirmed (step B11). If it is confirmed from the result of the verify processing that the writing has not been performed regularly, the verify error flag is set (step B12). Alternatively, however, the writing operation may be performed again.

If the result of the verify processing proves that the writing has been performed regularly, then the verify end flag and the rewriting end flag are set (steps B13, B14), thereby ending the rewriting processing.

As described above, in the present embodiment, every time a step of rewriting processing is completed, a history representing that the step is completed is recorded into the flag area. Consequently, when a normal program is started, it can be detected whether rewriting processing is completed or not and in which stage the processing is interrupted by confirming the flag area of flash area 4.

Figure 10:
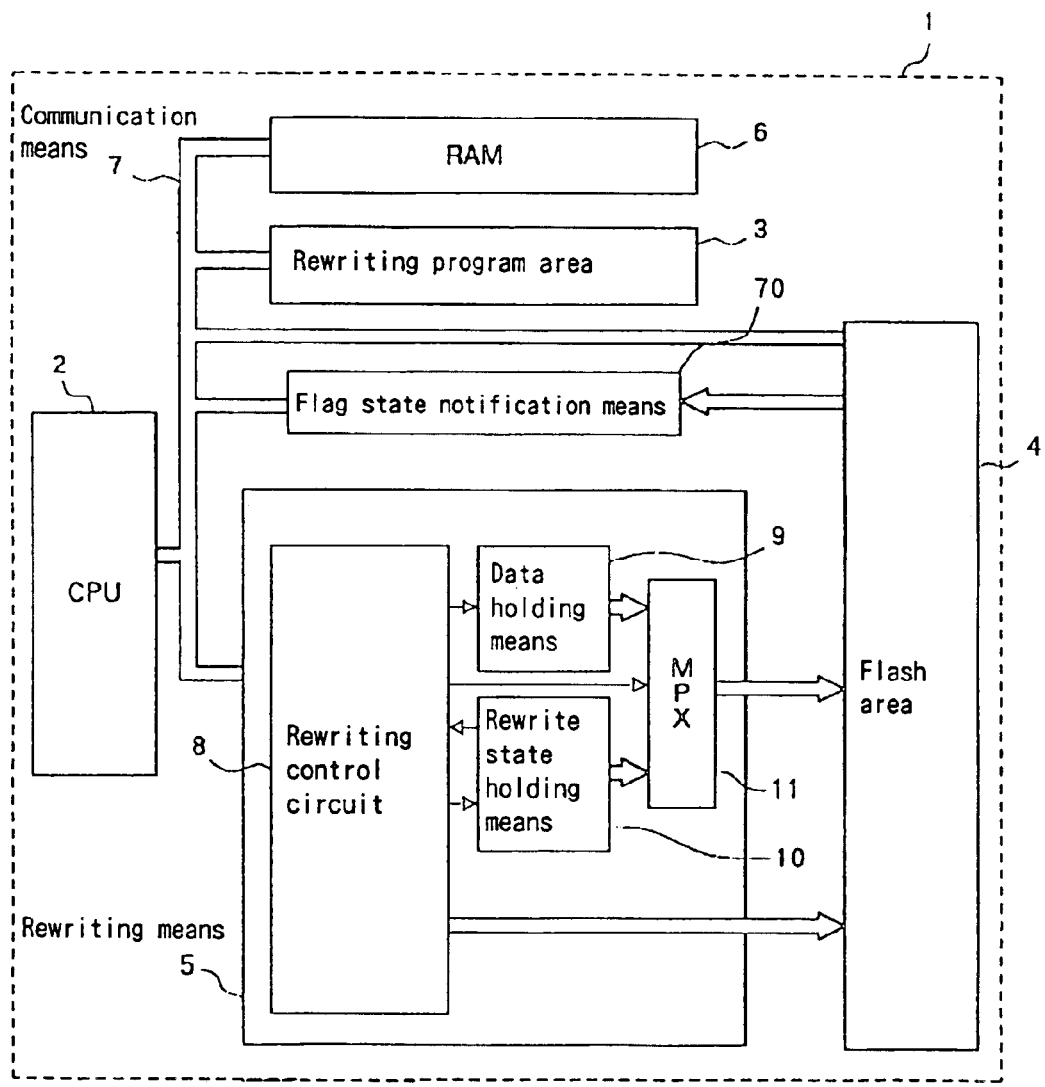
FIG. 10 is a block diagram showing a configuration of a second embodiment of the present invention.

FIG. 10 is a block diagram showing a configuration of a second embodiment of the present invention. The second embodiment of the present invention will be described below with reference to FIG. 10.

The present embodiment is different from the first embodiment in the configuration of rewriting means 5 which, in the first embodiment, merely performs a rewriting operation in order to reduce the burden to CPU 2. The present embodiment is similar in the components to those of the first embodiment shown in FIG. 4, and the like components thereof are denoted by like reference numerals and overlapping description of them is omitted here to avoid redundancy.

Rewriting means 5 in the present embodiment includes rewriting control circuit 8, data holding means 9, rewrite state holding means 10, and multiplexer (MPX) 11.

Rewriting control circuit 8 controls data holding means 9, rewrite state holding means 10 and multiplexer 11 to effect control of designation of a rewriting area in flash area 4 and control of rewriting of flash area 4 such as writing and erasure. Rewriting control circuit 8 outputs address information of a block which is an object of rewriting and address information of a flag for the block.

Data holding means 9 stores write data for the data area in flash area 4, and outputs the write data to multiplexer 11 under the control of rewriting control circuit 8.

Rewrite state holding means 10 stores information regarding different processing stages of rewriting processing and information of a block which is an object of rewriting.

Multiplexer 11 is controlled by rewriting control circuit 8 such that, upon writing into the data area, multiplexer 11 selects the output of data holding means 9 and outputs it to flash area 4, but upon writing into the flag area, multiplexer 11 selects an output value of rewrite state holding means 10 and outputs it to flash area 4.

The output value from rewrite state holding means 10 to multiplexer 11 is a value which is written into the flag area when each process of rewriting processing is completed, and is updated by rewriting control circuit 8 each time the control advances to a next processing stage.

As described above, rewriting of each flag area in the present embodiment is performed by rewriting control circuit 8 in accordance with contents of address information stored in rewrite state holding means 10. CPU 2 performs starting of a rewriting operation and determination of writing contents, but need not allocate the flag areas to particular addresses. This reduces the burden to CPU 2 and allows CPU 2 to perform some other processing. Consequently, the processing coefficient is augmented.

In FIG. 10, the embodiment shown includes flag state notification means 70 in addition to the components described above. Flag state notification means 70 compares, when power supply is made available after rewriting is completed, values read out from the flag areas and expected values for the flag areas stored in advance and notifies CPU 2 by interrupt whether rewriting of the flash areas has been performed regularly. Although the comparing operation is usually performed by CPU 2, the construction just described eliminates the necessity for CPU 2 performing the comparing operation, and this further augments the processing efficiency.

Since the present invention is constructed in the manner described above, the following effects are achieved.

The first effect is that a malfunction arising from an interruption of rewriting processing can be prevented and a failure or a fatal accident of a set can be prevented because, upon rewriting processing of a flash area, a history of rewriting processing is written into a flag area and, before processing is performed for a program in the flash area, confirmation of whether the writing processing is completed regularly or not can be performed rapidly and with certainty merely by referring to the flags.

The second effect is that, since a history of rewriting processing can be left in a starting stage of the rewriting processing, also an interruption of the rewriting processing such as erasing processing in an initial stage can be detected.

The third effect is that, since a history of completion of a process can be left by each process in rewriting processing, when rewriting is performed again after the rewriting processing is interrupted, the rewriting processing can be resumed beginning with a process immediately following the process at which the rewriting processing has been interrupted.

The fourth effect is that, where the data areas are set to successive addresses, a program can be produced readily.

Further, when compared with a conventional configuration wherein a program is transferred from a flash memory to a RAM in order to execute the program, the present invention has an effect that the cost for the RAM for execution of a program can be eliminated and the time required to start a normal processing program can be reduced.

While preferred embodiments of the present invention have been described using specific terms, such description is for illustrative purposes only, and it is to be understood that changes and variations may be made without departing from the spirit or scope of the following claims.

What is claimed is:

1. A microcomputer provided with a flash memory and having a self-programming function of rewriting a program stored in said flash memory, comprising:
   a rewrite program area for storing a program for a rewriting processing procedure for said flash memory; and
   a controller for forming a flag area locally in said flash memory when the rewriting program stored in external storage means or said rewrite program area is written into said flash memory, performing determination of completion of a plurality of stages of rewriting processing or determination of whether the plurality of stages are good or bad and rewrites recording results of the determination of completion of each stage or results of determination of whether each stage is good or bad into said flag areas a stage at a time,
   wherein said rewriting processing is performed in accordance with said rewriting program, and said stages comprise: erasure of the flag area; blank check of data area; and writing of data into said data area.

2. A microcomputer provided with a flash memory according to claim 1, wherein said flash memory includes a plurality of blocks each of which is an erasable unit and includes said data area and said flag area, and said controller maps the data areas of the plurality of blocks to successive addresses.

3. A microcomputer provided with a flash memory and having a self-programming function of rewriting a program stored in said flash memory, comprising:
   a rewrite program area for storing a program for a rewriting processing procedure for said flash memory;
   a controller for forming a flag area locally in said flash memory when the rewriting program stored in external storage means or said rewrite program area is written into said flash memory, performing determination of completion of a plurality of stages of rewriting processing or determination of whether the plurality of stages are good or bad and recording results of the determination into said flag areas; and
   said controller writing an expected value when rewriting is completed regularly into the flag area at the last stage of rewriting processing and changes said expected value at the first stage of rewriting processing,
   wherein said rewriting processing is performed in accordance with said rewriting program, and said stages comprise: erasure of the flag area; blank check of data area; and writing of data into said data area.

4. A microcomputer provided with a flash memory and having a self-programming function of rewriting a program stored in said flash memory, comprising:
   a rewrite program area for storing a program for a rewriting processing procedure for said flash memory;
   rewriting means for forming a plurality of flag areas locally in said flash memory when the rewriting program stored in external storage means or said rewrite program area is written into said flash memory; and
   a controller for performing determination of completion of a plurality of stages of rewriting processing or determination of whether the plurality of stages are good or bad and rewrites recording results of the determination of completion of each stage or results of determination of whether each stage is good or bad into said flag areas a stage at a time,
   wherein said rewriting processing is performed in accordance with said rewriting program, and said stages comprise: erasure of the flag area; blank check of data area; and writing of data into said data area.

5. A microcomputer provided with a flash memory according to claim 4, wherein said flash memory includes a plurality of blocks each of which is an erasable unit and includes said data area and said flag area, and said rewriting means maps the data areas of the plurality of blocks to successive addresses.

6. A microcomputer provided with a flash memory and having a self-programming function of rewriting a program stored in said flash memory, comprising:
   a rewrite program area for storing a program for a rewriting processing procedure for said flash memory;
   rewriting means for forming a plurality of flag areas locally in said flash memory when the rewriting program stored in external storage means or said rewrite program area is written into said flash memory;
   a controller for performing determination of completion of a plurality of stages of rewriting processing or determination of whether the plurality of stages are good or bad and rewrites recording results of the determination of completion of each stage or results of determination of whether each stage is good or bad into said flag areas a stage at a time; and
   flag state notification means for comparing, when power supply is made available after the rewriting is completed, values read out from said flag areas with expected values for said flag areas stored in advance and notifying said controller of results of the comparison,
   wherein said rewriting processing is performed in accordance with said rewriting program, and said stages comprise: erasure of the flag areas; blank check of data area; and writing of data into said data area.

7. A microcomputer provided with a flash memory according to claim 6, wherein said flash memory includes a plurality of blocks each of which is an erasable unit and includes said data area and said flag areas, and said rewriting means maps the data areas of the plurality of blocks to successive addresses.

8. A flash memory used in rewriting a stored program, comprising:
   a flag area for rewriting recording results of the determination of completion of each stage of a plurality of stages or results of determination of whether the each stage of the plurality of stages is good or bad a stage at a time,
   wherein rewriting is performed in accordance with a rewriting program stored in the flash memory, and said stages comprise: erasure of the flag area; blank check of data area; and writing of data into said data area.

9. A flash memory used in rewriting a stored program, comprising:
   a flag area for writing an expected value when rewriting is completed regularly into the flag area at the last stage of rewriting processing and changes said expected value at the first stage of rewriting processing,
   wherein rewriting is performed in accordance with a rewriting program stored in the flash memory, and said rewriting processing comprise a plurality of stages including erasure of the flag area, blank check of data area, and writing of data into said data area.

10. A method of storing a program into a flash memory of a microcomputer provided with said flash memory and having a self-programming function of rewriting the program stored in said flash memory, said method comprising:

forming a plurality of flag areas in said flash memory when a rewriting program is written into said flash memory;

determining completion of a plurality of stages of rewriting processing or determining whether the plurality of stages are good or bad; and after results of the determination are made, rewriting recorded results of the determination of completion of each stage or results of determination of whether each stage is good or bad into said flag areas a step at a time, wherein rewriting of the program is performed in accordance with said rewriting program, and said stages comprise: erasure of the flag area; blank check of data area; and writing of data into said data area.

* * * * *